United States Patent [19]

Glover et al.

[11] Patent Number: 4,698,591
[45] Date of Patent: Oct. 6, 1987

[54] METHOD FOR MAGNETIC FIELD GRADIENT EDDY CURRENT COMPENSATION

[75] Inventors: Gary H. Glover, Delafield; Norbert J. Pelc, Wauwatosa, both of Wis.

[73] Assignee: General Electric Company, Milwaukee, Wis.

[21] Appl. No.: 816,074

[22] Filed: Jan. 3, 1986

[51] Int. Cl.⁴ ............................................. G01R 33/20
[52] U.S. Cl. ..................................... 324/307; 324/318
[58] Field of Search ............... 324/300, 318, 315, 319, 324/320, 322; 335/216

[56] References Cited

U.S. PATENT DOCUMENTS

| 4,585,995 | 4/1986 | Flugan | 324/318 |
| 4,590,428 | 5/1986 | Muller | 324/320 |
| 4,631,481 | 12/1986 | Young et al. | 324/318 |

Primary Examiner—Michael J. Tokar
Attorney, Agent, or Firm—Mark L. Mollon; Douglas E. Stoner

[57] ABSTRACT

A method is provided for characterizing the spurious, time-dependent magnetic field gradient response and for compensating therefor. In accordance with the method a small sample object is placed away from the system isocenter where the gradient to be compensated is non-zero. A magnetic field gradient pulse is applied to the sample, followed by the application after a variable time of a 90° radio frequency pulse. The phase of the resulting free induction decay (FID) signal is monitored as a function of total time since the end of the gradient pulse. These data are related to the gradient impulse response and are fit to a set of (e.g., two or three) exponentials by regression techniques wherein an initial estimate is improved in one embodiment by chi-squared minimization of a Taylor's series expansion about the initial estimate point.

4 Claims, 14 Drawing Figures

FIG. 7A — RAW DATA — FIT TO $c_3 = \alpha_3(1-e^{-t/T_3})$

FIG. 7B — RAW $-c_3$ — FIT TO $c_2 = \alpha_2(1-e^{-t/T_2})$

FIG. 7C — RAW $-c_3-c_2$ — FIT TO $c_1 = \alpha_1(1-e^{-t/T_1})$

METHOD FOR MAGNETIC FIELD GRADIENT EDDY CURRENT COMPENSATION

BACKGROUND OF THE INVENTION

This invention relates to magnetic resonance (MR) techniques. More specifically, this invention relates, in the preferred embodiment, to a calibration method for MR magnetic field gradient eddy current compensation filters. The invention is applicable to magnetic resonance imaging, but is not limited thereto.

The magnetic resonance phenomenon has been utilized in the past in high resolution magnetic resonance spectroscopy instruments by structural chemists to analyze the structure of chemical compositions. More recently, MR has been developed as a medical diagnostic modality having applications in imaging the anatomy, as well as in performing in vivo, noninvasive spectroscopic analysis. As is now well known, the MR phenomenon can be excited within a sample object, such as a human patient, positioned in a homogeneous polarizing magnetic field, $B_o$, by irradiating the object with radio frequency (RF) energy at the Larmor frequency. In medical diagnostic applications, this is typically accomplished by positioning the patient to be examined in the field of an RF coil having a cylindrical geometry, and energizing the RF coil with an RF power amplifier. Upon cessation of the RF excitation, the same or different RF coil is used to detect the MR signals, frequently in the form of spin echoes, emanating from the patient volume lying within the field of the RF coil. In the course of a complete MR scan, a plurality of MR signals are typically observed. The signals are used to derive MR imaging or spectroscopic information about the object studied.

The application of magnetic resonance to imaging depends upon the use of magnetic field gradients to encode spatial information within the NMR signal. Any departure from the ideal gradient behavior can be expected to introduce image distortion. For example, imperfect rephasing of the nuclear spins and an attendant loss of signal occurs if the gradients are not constant during selective time reversal pulse sequences (i.e., use of 180° time-reversal RF pulses). This effect compounds in later spin echoes of multi-echo (Carr-Purcell-Meiboom-Gill) sequences. In addition, if the gradient field is not zero when it should be (due, e.g., to residual decay from a previous gradient pulse) the unitended phase dispersion can result in distorted spectra in chemical shift imaging (CSI) sequences as well as inaccurate spin-spin relaxation time ($T_2$) determination in multi-echo sequences.

Such gradient distortions can arise if the gradient fields couple to lossy structures within the magnet, its cryostat (if the magnet is of superconductive design) or shim coil system, or the RF shield used to decople the gradient coils from the RF coil. The spurious response components derive from induction of currents in the ambient structures and/or loss of energy to the shim coils and are manifested as multi-compartment relaxation behavior. One observes, for example, an approximately exponential rise and decay of gradient fields during and after, respectively, the application of a rectangular current pulse to the gradient coil.

A scheme has been proposed which, in one embodiment, uses an analog pre-emphasis filter in the gradient power supply to shape the current applied to the gradient coil in such a way that the spurious gradient components are reduced. The filter may have a number (e.g., two) exponential decay components and adjustable potentiometers (e.g., four) which must be set during system calibration. A measurement technique is used to sample the uncorrected residual gradient field and calculate the potentiometer settings from analysis of the data. Other embodiments are envisioned wherein the current pulse may be shaped by techniques other than pre-emphasis-type filters, such as by generation of the desired current pulse shape by a computer.

Accordingly, it is an object of the present invention to provide a method for measuring the uncorrected field and to use this information to compensate for the gradient distortion.

It is another object of the invention to provide an improved method which uses NMR to measure the gradient response and which offers improved sensitivity.

It is a further object of the invention to provide an NMR method to measure the gradient response by monitoring the free-induction decay (FID) signal which reflects the entire integrated gradient history.

SUMMARY OF THE INVENTION

A method is provided for characterizing the spurious, time-dependent magnetic field gradient response and for compensating therefor. In accordance with the method a small sample object is placed away from the system isocenter where the gradient to be compensated in non-zero. A magnetic field gradient pulse is applied to the sample, followed by the application after a variable time of a 90° radio frequency pulse. The phase of the resulting free induction decay (FID) signal is monitored as a function of total time since the end of the gradient pulse. These data are related to the gradient impulse response and are fit to a set of (e.g., two or three) exponentials by regression techniques wherein an initial estimate is improved in one embodiment by chi-squared minimization of a Taylor's series expansion about the initial estimate point.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
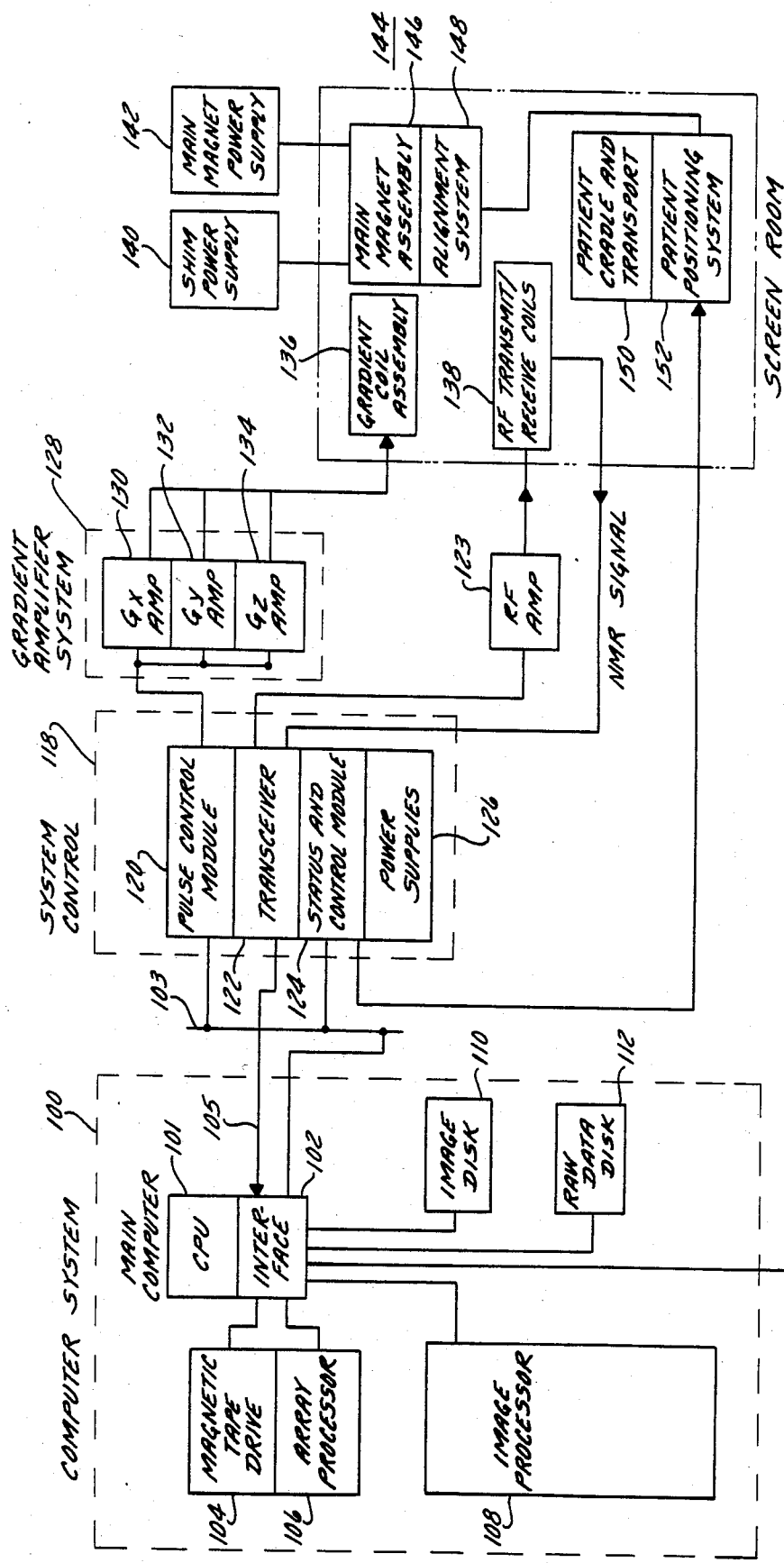
FIG. 1 depicts in block diagram form the major components of an exemplary MR system.

Referring first to FIG. 1, there is shown in block diagram form the major components of an exemplary MR system. It should be understood, however, that this is an exemplary embodiment of the apparatus and that in fact the invention is not apparatus dependent. The overall operation of the system is under the control of a host computer system generally designated 100 which includes a main computer 101 (such as a Data General MV4000). The computer has associated therewith an interface 102 through which a plurality of computer peripheral devices and other MR system components are coupled. Among the computer peripheral devices is a magnetic tape drive 104 which may be utilized under the direction of the main computer for archiving patient data and images to tape. Processed patient data may also be stored in an image disc storage device designated 110. An array processor 106 is utilized for pre-processing data and image construction. The function of image processor 108 is to provide interactive image display manipulation such as magnification, image comparison, and gray-scale adjustment. The computer system is provided with a means to store raw image data (i.e., before image construction) utilizing a disc data storage system designated 112. An operator console 116 is also coupled to the computer by means of interface 102 and provides the operator with the means to input data pertinent to a patient study as well as additional data necessary for proper MR system operation, such as initiating and terminating scans. The operator console may also be used to display images stored on discs or magnetic tape.

The computer system exercises control over the MR system by means of system control 118 and gradient amplifier system 128. The computer communicates with system control 118 by means of a digital communication network 103 (such as the Ethernet network) in a manner well known to those skilled in the art. The system control includes several subsystems such as the pulse control module (PCM) 120, a radio frequency transceiver 122, a status control module (SMC) 124, and the power supplies generally designated 126 necessary to energize the components. The PCM utilizes control signals provided by computer 101 to generate digital timing and control signals such as the current waveforms used for gradient coil excitation, as well as RF envelope waveforms utilized in the transceiver for modulating RF pulses. The gradient waveforms are applied to the gradient amplifier system 128 generally comprised of $G_x$, $G_y$ and $G_z$ amplifiers 130, 132, and 134, respectively, each utilized to excite a corresponding gradient coil in an assembly generally designated 136 and which is part of a magnet assembly 146. When energized, the gradient coils generate substantially constant magnetic field gradients $G_x$, $G_y$ and $G_z$ of the magnetic field in the same direction as the main magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_o$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x,y,z) = B_0 + G_x X + G_y Y + G_z Z$. The $G_x$ gradient has no effect on the plane x=0. Similar, $G_y$ and $G_z$ have no effect on the planes y=0 and z=0, respectively. The point (0,0,0) is termed "isocenter" and is the point in space where none of the gradients have any effect. Isocenter is normally situated substantially at the center of the static magnetic field volume.

The gradient magnetic fields are utilized in combination with radio frequency pulses generated by transceiver 122, RF amp 128 and RF coil 138 to encode spatial information into the MR signals emanating from the region of the patient being studied. Waveforms and control signals provided by the pulse control module are utilized by transceiver subsystem 122 for RF carrier modulation and control of the operating mode; that is, the transmit or receive mode. In the transmit mode, the transmitter provides a radio frequency carrier waveform modulated in accordance with the control signals to an RF power amplifier 123 which then energizes RF coils 138 which are situated within main magnet assembly 146. The NMR signals radiated by the excited nuclei are sensed by the same or a different RF coil than is used for transmitting. The signals are detected, amplified, demodulated, filtered, and digitized in the receiver section of the transceiver. The processed signals are transmitted to the main computer for processing by means of a dedicated, unidirectional, high-speed digital link 105 which links interface 102 and transceiver 122.

The PCM and SCM are independent subsystems both of which communicate with main computer 101, peripheral systems, such as patient positioning system 152, as well as to one another by means of link 103. The PCM and SCM are each comprised of a 16 bit microprocessor (such as an Intel 8086) for processing commands from the main computer. The SCM includes means for acquiring information regarding patient cradle (not shown) position and position of the moveable patient alignment light fan beam (not shown). This information is used by the main computer to modify image display and reconstruction parameters. The SCM also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The shim power supply is utilized to energize shim coils associated with the main magnet and which are used to correct inhomogeneities in the polarizing magnetic field. In the case of a resistive magnet, main magnet power supply 142 is utilized to continuously energize the magnet. In the case of a superconductive magnet, the power supply is utilized to bring the magnet to the proper operating field and then is disconnected. In the case of a permanent magnet, power supply 142 would not be needed. The patient alignment system 148 operates in combination with a patient cradle and transport system 150 and patient positioning system 152. To minimize interference from external sources, the MR system components comprised of the main magnet assembly, the gradient coil assembly, and the RF transmit and receiver coils, as well as the patient-handling devices, are enclosed in an RF-shielded room generally designated 144. The shielding is generally provided by a copper or aluminum screen network which encloses the entire room. The screen network serves to contain the RF signals generated by the system, while shielding the system from RF signals generated outside the room. A bidirectional attenuation of approximately 100 db, is typical in the frequency range of operation.

Figure 2A:
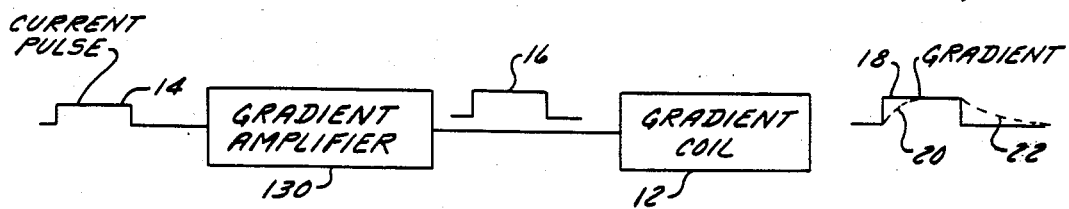
FIG. 2A shows in greater detail the conventional gradient amplifier and gradient coil chain.

Referring now to FIG. 2A, there is shown gradient amplifier 130 (also shown in FIG. 1) for energizing a gradient coil 12 to produce the $G_x$ gradient. Under ideal operating conditions, a rectangular current pulse 14 applied to amplifier 130 would be amplified, as indicated at 16, and when used to energize the gradient coil would result in a substantially rectangular gradient magnetic field pulse 18 being produced. However, as described hereinbefore, because of the coupling to lossy structures and spurious components due to induction of eddy currents, in practice, the resulting magnetic field gradient has a finite rise time as indicated at 20, and a finite decay as indicated at 22. As alluded to hereinbefore, such gradient distortions can lead to loss of signal and unintended phase dispersion.

Figure 2B:
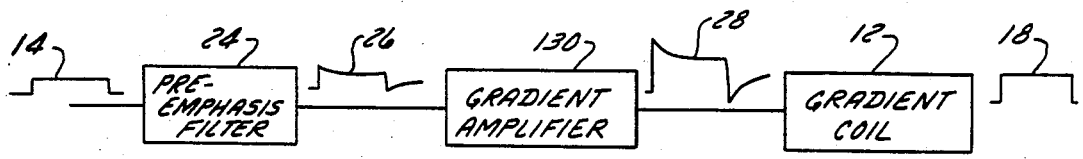
FIG. 2B illustrates a gradient amplifier and coil chain in which in accordance with one embodiment of the invention a pre-emphasis filter precedes the gradient amplifier.

In accordance with one embodiment of the invention the gradient distortions can be reduced by application of a current pulse 14, as shown in FIG. 2B, to a pre-emphasis filter 24 to predistort the current pulse, as indicated at 26, such that the amplified current pulse 28 applied to the gradient coil would produce the desired rectangular gradient pulse 18. Since in typical MN applications, gradient pulses are applied in at least each of the axes of the Cartesian coordinate system, an MR system for practicing the invention would have means functionally similar to that depicted in FIG. 2B to achieve correction along all axes. However, for simplicity the following discussion will refer to correction along only one of the axes.

In order to determine how current pulse 14 in FIG. 2B should be predistorted and therefore how pre-emphasis filter 24 should be calibrated to achieve the desired distortion, the nature of the gradient distortion to be eliminated must first be measured and analyzed. The manner in which this is accomplished using an MR system will be described next.

Figure 3A:
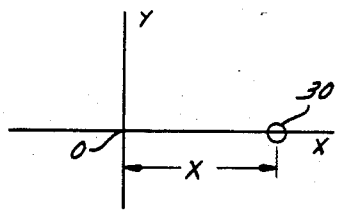
FIG. 3A depicts a sample positioned away from the isocenter of an MR system.
Figure 3B:
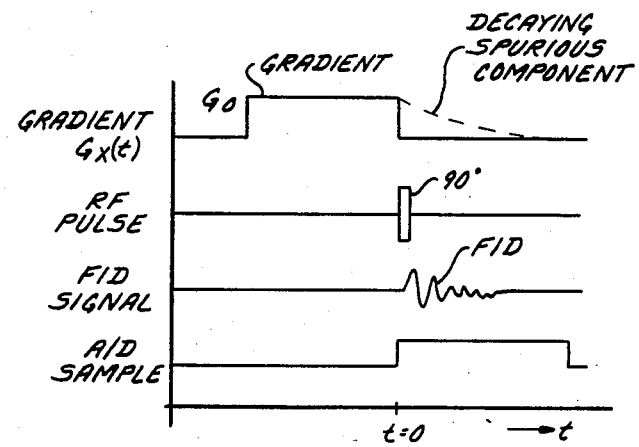
FIG. 3B depicts an exemplary pulse sequence in accordance with the invention for measuring the spurious component of a gradient pulse along one axis.

FIG. 3A depicts a sample 30 composed of an MR-active substance, conveniently a small bottle containing approximately one cc of water, positioned at a distance "x" from the gradient origin designated "0" (that is, the system isocenter) where the gradient is non-zero. Sample 30 will serve as the source of the NMR signals used to study gradient distortion using the pulse sequence diagrammed in FIG. 3B. FIG. 3B shows only a single gradient applied, for example, along the x-axis of an object. As previously indicated, the process to be described would in practice be repeated for other axes along which gradients requiring compensation are applied.

It may be helpful to initially consider an intuitive explanation of the principle underlying the present measurement method. As is shown in FIG. 3B, a gradient pulse is followed by the application of a 90° RF pulse which generates a free induction decay (FID) signal. If there are no spurious gradient components, then the sample object will be immersed in a constant magnetic field for all time during the FID. As a result, the instantaneous frequency of the FID will be constant as a function of time. If, however, the gradient pulse is followed by spurious components as shown by the dashed curve in FIG. 3B, then the magnetic field at the sample object will vary during the FID and so will the instantaneous frequency of the FID signal. Referring again to FIG. 3B, there is shown a gradient pulse being applied just before a 90° RF pulse. The resulting free induction decay signal will contain phase information whose instantaneous value at time "t" depends on the time integral of the gradient since the application of the RF pulse.

The FID signal, S(t) which is obtained from a sample with one dimensional density distribution P(x) (i.e., integrated over the y and z directions) and spin-spin relaxation time $T_2(x)$ is:

$$S(t) = \int P(x) e^{-t/T_2} e^{i\gamma x \int_0^t G_x(t')dt' + i\Delta\omega t} dx, \quad (1)$$

where $\gamma$ is the gyromagnetic ratio. $G_x(t)$ represents the gradient response of interest and $\omega$ is a constant resonance frequency offset which is discussed in more detail below. If the object is small (the effect of object size is discussed fully below), the phase of the signal S(t) is $$\phi(t) = \gamma x \int_o^t G_x(t')dt' + i\Delta\omega t. \quad (2)$$

It is seen that the phase of the FID signal contains information about the gradient response $G_x(t)$. The present invention utilizes this information to characterize the spurious gradient response using this measured phase. A further goal is to use the measured information to precompensate the gradient amplifier's current waveforms so as to produce the desired gradient fields. Thus in principle one need merely extract the phase from the FID signal as a function of time in order to characterize the spurious gradient. In practice, however, phase dispersion due to both constant $B_o$ inhomogeneity as well as from the gradient-induced inhomogeneity can lead to a $T_2^*$ decay much shorter than the characteristic relaxation times of the gradient. In this case the FID signal will decay before the full spurious component of the $G_x(t)$ curve has been sampled.

As a result of the $T_2^*$ decay, a single experiment such as is shown in FIG. 3B can only characterize the gradient field for a time comparable to $T_2^*$. Suppose the 90° RF pulse follows the gradient pulse after essentially no delay, and the FID is measured for a time $T_{AD}$ msec. ($T_{AD} \leq T_2^*$) immediately following the RF pulse. This measurement will characterize the gradient field for the first $T_{AD}$ msec. after the current pulse is shut off.

Now suppose the application of the RF pulse is delayed by $T_3$ msec. after the gradient current pulse is shut off and again sample the FID for $T_{AD}$ msec. after the RF pulse. If $T_3 < T_{AD}$, it will be possible to combine the data from this and the previous ($T_3 = 0$) experiment to allow the gradient field to be characterized for a longer period of time. This process can be repeated so that the full spurious response can be measured.

Figure 4A:
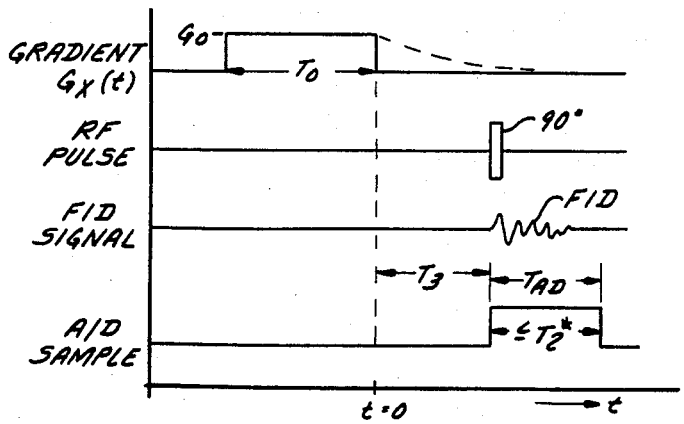
FIGS. 4A and 4B are similar to FIG. 3B and depict inventive pulse sequences suitable for measuring the spurious gradient response.
Figure 4B:
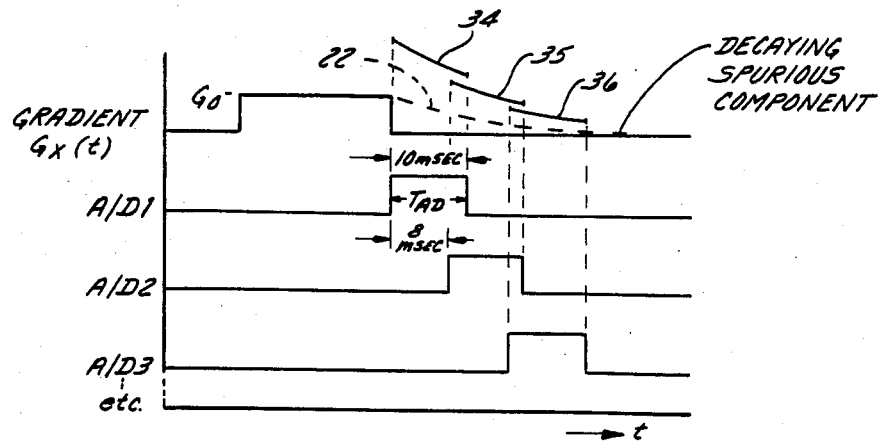

The sequence of FIG. 3B is therefore modified as shown in FIG. 4A so that a variable time delay $T_3$ is inserted between the gradient and RF pulse. A number of short acquisitions of length $T_{AD} \leq T_2^*$ are then obtained with $T_3$ incremented by $\Delta T_3 T_{AD}$ between acquisitions. In this way, the entire spurious gradient decay can be swept through the A/D acquisition window in small overlapping segments. In one implementation, $T_{AD}$ was selected to be 10 msec., while the change in the delay between segments was 8 msec. as shown in FIG. 4B, in which A/D₁, A/D₂, etc., indicate adjacent, overlapping segments in sampling the gradient spurious response curve. The total phase curve 22 is then obtained by combining the separate acquisitions 34, 35 and 36 shown in FIG. 4B.

In the analysis of the phase data from each acquisition and in the process of combining the data from the various acquisitions, use is made of the fact that $\phi(t)$ (Equation (2)) is continuous. Thus, even though the phase at any single point in time can only be calculated modulo $2\pi$, values of $\phi(t)$ much greater than $2\pi$ can be measured by "unwrapping" the measured phase. Similarly, the various segments are combined by forcing $\phi(t)$ to be continuous at the segment boundaries. In order to better match the segments at the boundaries, it is advantageous to overlap the segments somewhat.

In this way, $\phi(t)$ can be measured over time spans much greater than $T_2^*$ which are long enough to fully characterize the spurious gradient decay. A suitable analysis of these data then provides the desired characterization in the form, for example, of a multi-exponential decomposition. The ensuing discussion will describe the theory and regression analysis used to obtain the decomposition more fully.

Let the impulse response of the gradient be h(t). Because of the ease with which measured parameters can be converted to circuit component values, and because it is found to be a good approximation, it is convenient to approximate the impulse response of the gradient system by the sum of a finite number of exponential terms. Thus, h(t) is defined by:

$$h(t) = \delta(t) + \sum_{k=1}^{N} g_k e^{-\lambda_k t}, \quad (3)$$

in which $\delta(t)$ is the Dirac delta function and $g_k$ and $\lambda_k$ are the amplitude and rate constant, respectively, of the k'th exponential component. The gradient response is obtained by convolving the impulse response with the excitation function. For a rectangular excitation and pulse the definitions for the time parameters shown in FIG. 3A one obtains:

$$G(t = 0) = G_o \sum_{k=1}^{N} a_k(1 - e^{-\lambda_k T_o}) \equiv G_o \Sigma_k G_k, \quad (4)$$

where $$a_k = g_k/\lambda_k \quad (5)$$

is a dimensionless amplitude coefficient. Equation (4) expresses the gradient amplitude just after the end of the gradient pulse with the assumption that an infinite time has elapsed since any prior gradient excitation. After the excitation is terminated.

$$G_x(t') = G_o \Sigma_k G_k e^{-\lambda_k t'} \quad (6)$$

Substituting Equation (6) into Equation (2) yields:

$$\phi(t) = \gamma G_o x \Sigma_k G_k \tau_k (1 - e^{-\lambda_k t}) + \Delta \omega t \quad (7)$$

where $\tau_k = \lambda_k^{-1}$ is the relaxation time. Thus, if the position of the sample x (FIG. 3A) and the offset $\Delta\omega$ are known, and $\phi(t)$ is obtained from measurements of S(t), the coefficients $a_k$ and $\lambda_k$ needed to calibrate pre-emphasis filter 24 (FIG. 2B) can be obtained by chi-squared minimization techniques as discussed below.

Figure 5:
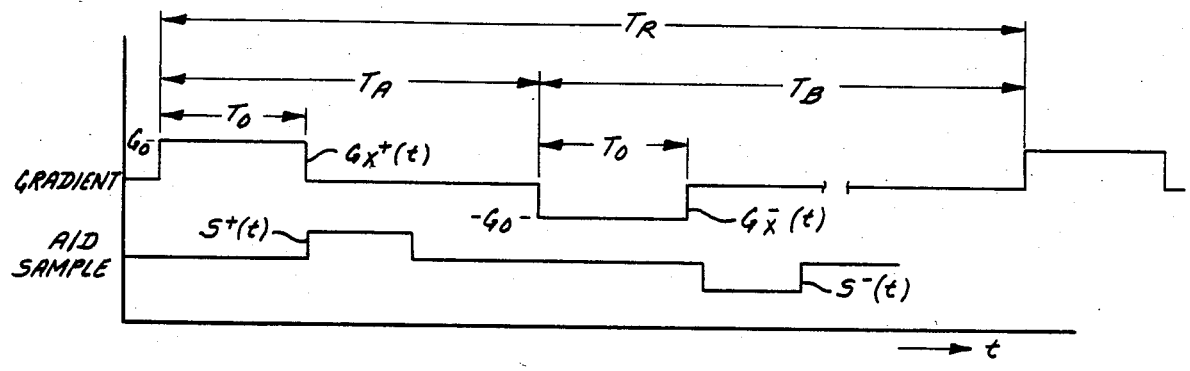
FIG. 5 is similar to FIG. 3B, but shows positive and negative gradient pulses.

The offset phase $\Delta\omega t$ derives from frequency synthesizer offset and/or field inhomogeneity. In the present embodiment, the frequency $\Delta\omega$ is determined by making a second measurement with the sign of the gradient $G_x^-(t)$ reversed relative to the preceding $G_x^+(t)$ gradient pulse, as shown in FIG. 5. The resulting signals $S^+(t)$ and $S^-(t)$ have opposite phase as suggested by the + and − superscipts. Since the phase due to the offset in Equation (7) does not change sign when the gradient sign is reversed, the offset frequency component is removed when the two measurements are subtracted. This is analogous to the method disclosed and claimed in commonly assigned U.S. Pat. No. 4,443,760.

The manner in which the position "x" of sample 30 (FIG. 3A) is measured using MR will be described next. The position of the sample is determined from the spectrum of a gradient-refocused spin-echo, as depicted in FIG. 6.

Figure 6:
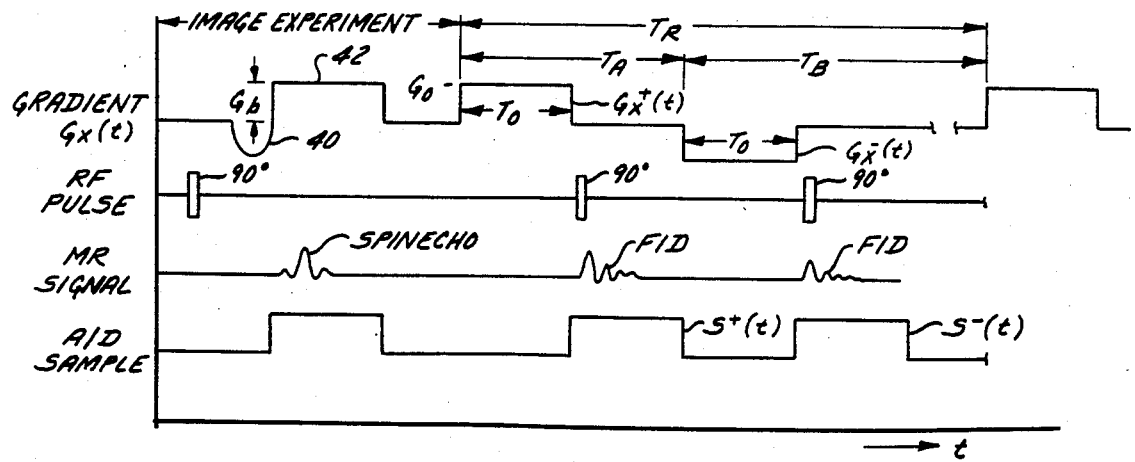
FIG. 6 depicts a preferred embodiment of a pulse sequence for measuring the position of the sample and for measuring the spurious component of a gradient pulse along one axis.

The pulse sequence of FIG. 6 is similar to that of FIG. 5 except that it includes an imaging experiment used to measure "x". The experiment includes the initial application of a 90° RF excitation pulse, followed by application of opposite polarity gradient pulses 40 and 42 which produce the spin-echo signal. Gradient pulse 42 is the readout gradient pulse (wherein $G_p = 120$ mg/cm), for example. If, as discussed hereinbefore, gradient correction is desired along other axes (e.g., y and z), a similar imaging experiment along those axes would be needed to measure the position ("y" and "z") of the sample.

Referring again to FIG. 6, let $G_p$ be the amplitude of the readout gradient. Then the frequency for the sample at position "x" is $$\omega_o = \gamma G_p x + \Delta \omega \quad (8)$$

where $\Delta\omega$ is a constant offset. The offset frequency is removed by gathering half the views with $G_p$ negated and subtracting the frequencies of the two half-scans, as described hereinabove. The frequencies are found by a standard thresholded moment analysis of the spectra.

The reason a spin echo is used to measure "x" instead of geometric means is that (1) the origin (or null point) of the gradient may be difficult to find, and (2) the gradient may not be perfectly linear, especially at the edges of the field of view. Thus, by using magnetic resonance signals to calculate "x", any errors in $G_o$ (FIG. 6) will be compensated by the same errors in $G_p$. Only the ratio $G_p/G_o$ is important.

Next, the effect of using an object of finite size is discussed. If the sample is not infinitesimal, as assumed in the discussion heretofore, the spurious gradient response will cause dephasing across the width of sample 30. This effect is like $T_2^*$ in that it limits the FID duration and can alter the relationship between $\phi(t)$ and the phase of S(t).

For simplicity assume a rectangular sample of width 2a centered at "x". Then the FID is $$S(t) = \frac{1}{2a} \int_{x-a}^{x+a} e^{i\gamma x \int_o^t G(t')dt'} dx, \quad (9)$$

or $$S(t) = e^{i\phi(t)} \text{sinc}\left[\phi(t)\frac{a}{x}\right]. \quad (10)$$

Thus, $S(t)$ is amplitude-modulated by the sinc function. Note from Equation (10) that the finiteness of the sample does not distort the phase measurement since arg $(S(t)) = \phi(t)$. It can be shown that this relationship holds for any symmetric object. Thus, no error is made in the measurement if the sample is symmetric even if it is not infinitesimal.

The modulation effect may be estimated by letting the gradient during the FID be constant. Then the first null in the amplitude occurs at time $T_2^*$, where $$\alpha\gamma G_o a T_2^* = \pi \quad (11)$$

Thus an upper limit to the gradient $G_o$ is obtained by setting the FID duration $T_2^*$ equal to the A/D window duration. For example, if $\alpha = 8\%$ and if a $T_2^* \geq 10$ msec. is desired, then $G_o \leq 200$ mgauss/cm.

The final data determination after phase offset correction and "x" determination is $$M(t) = \frac{\phi(t)}{\omega_o} \frac{G_p}{G_o} = \Sigma_k \alpha_k (1 - e^{-T_o \lambda_k}) \tau_k (1 - e^{-t\lambda_k}). \quad (12)$$

Thus, coefficients $A_k$, $\tau_k$ are sought in the expansion $$M(t_i) = \Sigma_k A_k (1 - e^{-t_i/\tau_k}), \, i = 1, \ldots, N_m, \quad (13)$$

where there are $N_m$ measurements at times $t_i$, and $$A_k \equiv \alpha_k (1 - e^{-T_o/\tau_k}) \tau_k. \quad (14)$$

In one imaging system it is found that two or three exponentials fit the data quite well. In other applications, fewer or more exponential components may be needed. The techniques used to decide how many terms are needed are well known in the art as disclosed, for example, in a text by Bevington identified hereinafter.

To characterize the spurious gradient response, the coefficients $(A_k)$ and $(\tau_k)$ must be calculated. A reasonable approach is to perform a least square fit (or $\chi^2$ minimization). As can be seen in Equation (13), the expression to be fit is not linear in these coefficients. Methods for non-linear $\chi^2$ minimization are well known. Several are described in the Bevington text. A description of the method used to fit data from one particular imaging system will now be described. Either two or three exponential terms may be fit.

Figure 7:
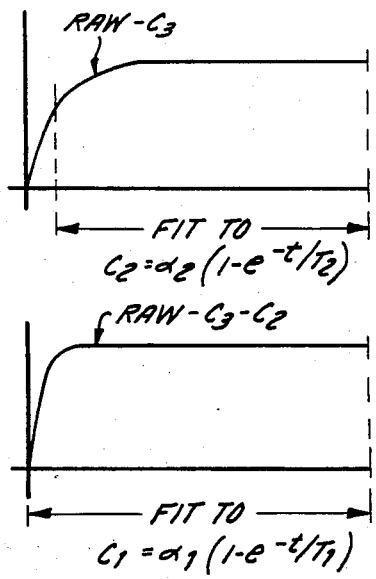
FIGS. 7A–7C depict various data curves for performing a regression analysis.

First, a preliminary fit for the longest time constant term is calculated. For this preliminary fit, data for late times is used, as shown in FIG. 7A, so that the shorter time constant terms can be ignored. For time "t" greater than the shorter time constants $$M(t) \sim A_o - A_N e^{-t/\tau_N} \quad (15)$$

where N is the exponential term with the longest time constant and $$A_o = \sum_{k=1}^{N} A_k. \quad (16)$$

A conventional iterative $\chi^2$ minimization method is used to calculate $A_o$, $A_N$ and $\tau_N$ (Equation (15)). The coefficients $A_N$ and $\tau_N$ comprise the preliminary fit to the longest time constant term. Next, this longest term is subtracted from the measured data $$M'(t) = M(t) - A_N(1 - e^{-t/\tau_N}) \simeq \sum_{k=1}^{N-1} A_k(1 - e^{-t/\tau_k}), \quad (17)$$

and this modified data is used to perform a preliminary fit for the term with the second longest time constant. Again, a window of data is chosen so that the effects of any remaining term can be ignored. This is graphically shown in FIG. 7B. Using a procedure similar to the one described above, $A_{N-1}$ and $\tau_{N-1}$ are calculated. If three time constants are being considered, the process of subtracting the preliminary fit and computing the coefficients for the next shorter term are repeated, as shown in FIG. 7C.

In this way, preliminary values for the coefficients are calculated. It is found that further processing, specifically to simultaneously fit to all the exponential terms, can improve the fit. One simple procedure is to keep the time constants $(\tau_k)$ fixed to their previous estimated values, but to calculate the values of the amplitudes $(A_k)$ which minimize $\chi^2$. As can be seen in Equation (13), this fit is linear in the amplitude coefficients and so it involves a straight forward linear least-square fit and the solution of an $N \times N$ system of equations.

Another calculational method that has been found to be useful is to improve the fit by a Marquardt procedure with a Taylor's expansion of the $\chi^2$ function about the initial guess point retaining only terms up to first derivatives, as described in P. R. Bevington. "Data Reduction and Error Analysis for the Physical Sciences," McGraw Hill Book Co., N.Y., 1969, pp. 232-235. This process works well if the initial guess is reasonably close. A $2N \times 2N$ linear system of equations is solved by standard numerical matrix inversion techniques. It is found that digital computational accuracy, even when double precision floating point arithmetic is used, can limit the accuracy of the fit coefficients. To improve the accuracy of the fit, only the time constants resulting from this Marquardt procedure are retained. The amplitude coefficients are calculated using the linear fit procedure described above.

Thus, the complete fit procedure consists of: (a) preliminary fit to each of the exponential terms by subtracting the previous preliminary fits and using only a subset of the data; (b) retain only the time constant coefficients $(\tau_k)$ and calculate new amplitude coefficients $(A_k)$ using a linear fitting procedure; (c) expand the $\chi^2$ expression using a Taylor series about the previous fit results and calculate a new fit to minimize $\chi^2$; and (d) retain only the time constant coefficients $(\tau_k)$ and calculate new amplitude coefficients $(A_k)$ using a linear fitting procedure.

The steps (c) and (d) are repeated until $\chi^2$ no longer decreases significantly.

Equation (7) described above, assumes that the gradient response has fully recovered since any previous pulse by the time the sequence is played out. In practice, this is not the case for components with long-time constants $\tau_k$ (i.e., $\tau_k$ comparable or larger than the separation time between gradients), and a correction must be made as will be described next.

Suppose $k(t)$ is modelled with exponential components ($N = 3$) and that only the third component ($k = 3$)

has a long enough time constant for the present effect to operative. Because of the application of the positive, $G_x^+(t)$, and negative, $G_x^-(t)$, gradients described above, there are two gradients of alternating signs in the pulse sequence, as depicted in FIG. 5. For this sequence, the field following the positive gradient after dynamic equilibrium has been set up is $$G_x^+(t) = G_o(t) + \tag{18}$$

$$G_o G_3 \tau_3 e^{-\lambda_3 t} \left( \sum_{n=o}^{\infty} e^{-\lambda_3(nTR+TR)} - \sum_{n=o}^{\infty} e^{-\lambda_3(nTR+Te)} \right),$$

where $G_o(t)$ is the gradient in the absence of overlap of spurious components (Equation 7), and, again, only the third exponential component of the impulse response is presumed long enough for this overlap effect to be important. A similar equation holds for the spurious gradient following the negative pulse $G_x^-(t)$. Since the total offset-corrected phase is proportional to the difference between $G_x^+(t)$ and $G_x^-(t)$, the total phase due to just the long component is (from Equation (18)

$$\phi_3(t) = \phi_{30} \frac{e^{i\lambda TR} - \frac{1}{2}(e^{-\lambda_3 TA} + e^{-\lambda_3 TB})}{1 - e^{-\lambda_3 TR}} \tag{19}$$

where $\phi_{30}$ is the infinite TR phase given by Equation (7) for k=3. Since, as will be shown, $\alpha_3$ is proportional to $\phi_3$, the corrected $\alpha_3$ becomes $$\alpha_3 = \alpha_3 \text{ (meas)} \left( 1 + \frac{e^{-\lambda_3 TR} - \frac{1}{2}e^{-\lambda_3 TA} + e^{-\lambda_3 TB}}{1 - e^{-\lambda_3 TR}} \right), \tag{20}$$

where $\alpha_3$ (meas) is the uncorrected measurement.

Once the coefficients of the impulse response are determined, as discussed above, the deconvolution (pre-emphasis) filter may be determined as described next.

The significance of the impulse response given in Equation (3) is that if a deconvolution filter $k(t)=h(t)^{-1}$ is first applied to the excitation, the net response will follow the desired excitation. Thus the pre-emphasis filter is obtained as the inverse of the impulse response. To calculate this, let $$h(t) = \delta(t) + \epsilon(t) \tag{21}$$

define the error function $\epsilon(t)$. Then, it may be verified (h*k=δ(t)) that the appropriate filter is $$k(t) = \delta(t) - \epsilon(t) + \epsilon^* \epsilon(t) - \epsilon^* \epsilon^* \epsilon + \tag{22}$$

where "*" denotes convolution. Note that if $\epsilon$ is of order $\alpha \approx 5\%$, then the higher order terms $\epsilon^* \epsilon$, etc., are negligible. It has been chosen that only the first term is retained since then the pre-emphasis filter, in one embodiment, is just a series of first order RC networks with amplitudes $\alpha_k$ and time constants $\tau_k$.

Figure 8:
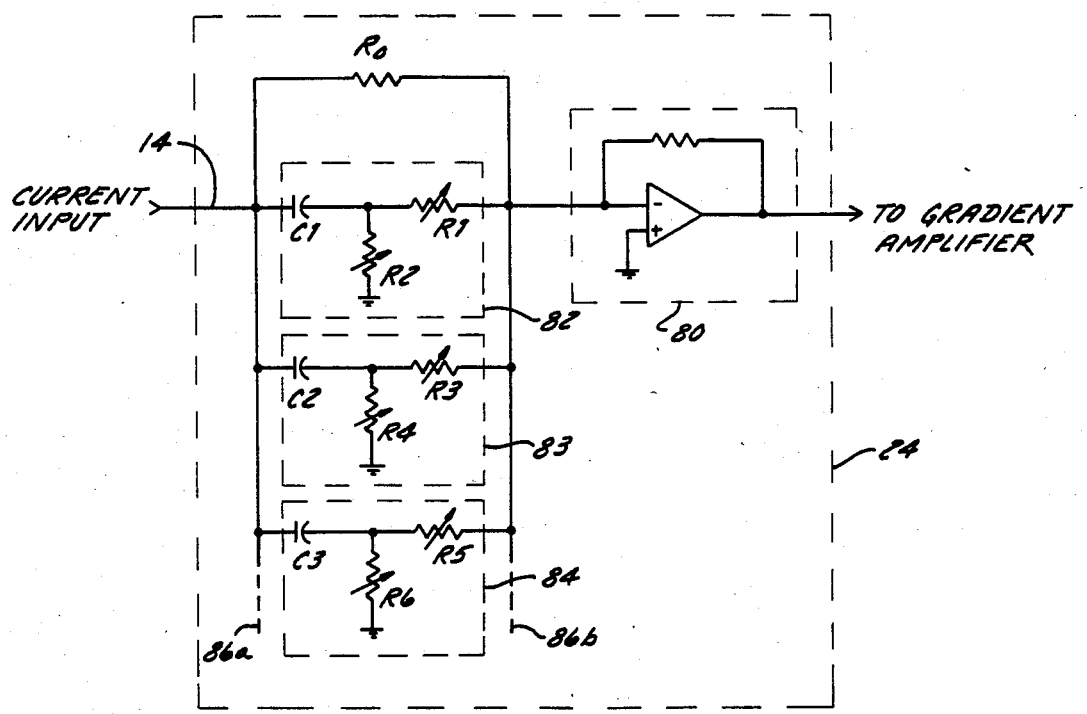
FIG. 8 depicts one exemplary embodiment of a pre-emphasis filter.

One exemplary embodiment of a pre-emphasis filter, such as pre-emphasis filter 24, FIG. 2, is illustrated in circuit schematic form in FIG. 8. The amplifier is made up of an operational amplifier 80 and filter components 82, 83, and 84. The predistorted output which is applied to gradient amplifier (e.g., 130, FIG. 2B) for energizing a gradient coil. At its input the operational amplifier is energized by a current pulse 14 through an input resistor Ro and one or more parallel-connected RC networks 82-84. The number of RC networks depends on the desired precision in pre-emphasis to be applied to the current input 14 to achieve compensation in the gradient pulse. Dash lines 86a and 86b suggest that additional RC networks may be added as needed. Each RC network is comprised at its input of a capacitor (e.g., C1) connected in series with an output variable resistor (e.g., R1). The common point between the capacitor and variable resistor is coupled to ground through a second variable resistor (e.g., R2). The circuit shown in FIG. 8 provides three exponential correction (since there are three RC networks). In some applications it has been found that two RC networks provide adequate correction (pre-emphasis).

After the coefficients are calculated, the resistance settings for the variable resistors (e.g., R1–R6) in the RC networks can be obtained. In principle, if the response of amplifier 24 has been perfectly modeled by the circuit calcualtion, the measured response will be perfectly compensated. In practice, of course, the component tolerances of capacitors may result in some departure from the ideal. In this case an iterative correction step may be used wherein the measured response after correction is fit to a new set of exponentials using the previous time constants, and the resulting error amplitudes for each component are added to the previous values. This iterative process may be repeated, although it has been found that in some cases no iterations are needed.

Although one embodiment of the invention has been described above which uses an exponential pre-emphasis filter, it will be recognized that other filter implementations (such as active filter designs) may be devised by those skilled in the art. Additionally, embodiments are envisioned in which following measurement of the decaying spurious component pre-emphasis (or predistortion) of the signal energizing the gradient coil may be achieved using software techniques without the aid of pre-emphasis filters.

In accordance with such software techniques, for example, once k(t) is found using Equation (22), it may be applied by numerical convolution techniques to the data used to generate the gradient waveform, prior to applying the gradient waveform to the gradient amplifiers.

Thus, let $w(t_k)$ be the desired gradient waveform for a gradient to be applied along particular axes. Then the corrected waveform which must be applied to the gradient amplifier for the actual response to be corrected is $$w_c(t_k) = \sum_{j=1}^{N} w(t_{k-j}) \cdot k(t_j), \tag{23}$$

where N denotes the number of points in the sampled filter kernel k. This operation may either be performed by a computer (such as computer 101, FIG. 1) before the waveform is stored in a readout memory, or it may be performed in nearly real time by computation from a stored wave $w(t_k)$.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A method for magnetic field gradient coil compensation comprising the steps of:

(a) positioning an NMR-active sample within a polarizing magnetic field and away from the isocenter of an MR scanner apparatus;

(b) applying along at least one axis of said MR scanner apparatus a gradient pulse;

(c) irradiating said sample with an RF excitation pulse within a predetermined time following application of said gradient pulse so as to generate an NMR signal;

(d) measuring and storing as data the phase of said NMR signal with respect to a reference phase and as a function of the total time since the application of said gradient pulse;

(e) calculating the impulse response to said gradient pulse using the stored phase data and storing the same as data; and (f) calculating the values of a compensation circuit which is employed with the gradient coil using the stored impulse response data.

2. The method as recited in claim 1 in which steps (b) through (d) are repeated a plurality of times to produce a plurality of sets of phase data, each of which sets represent the phase of said NMR signal over a different time interval after the application of said gradient pulse; and the stored phase data over the total time since the application of the gradient pulse is produced by concatenating said sets of phase data.

3. The method as recited in claim 1 in which steps (a) through (f) are repeated for each axis of the MR scanner along which a magnetic field gradient coil produces a magnetic field gradient.

4. The method as recited in claim 1 in which the calculation of the values of the compensation circuit recited in step (f) includes a regression technique to fit a plurality of exponentials to the stored impulse response data.

* * * * *

UNITED STATES PATENT AND TRADEMARK OFFICE
CERTIFICATE OF CORRECTION

PATENT NO. : 4,698,591            Page 1 of 2

DATED : October 6, 1987

INVENTOR(S) : Gary H. Glover and Norbert J. Pelc

It is certified that error appears in the above-identified patent and that said Letters Patent is hereby corrected as shown below:

Col. 5, line 32, change "MN" to --MR--.

Col. 6, line 17, Equation (1) delete

" $S(t) = \int P(x) e^{-t/T_2} e^{i\gamma x \int_0^t G_x(t') dt' + i\Delta\omega\, t_{dx}}$ " and replace with -- $S(t) = \int P(x) e^{-t/T_2} e^{i\gamma x \int_0^t G_x(t') dt' + i\Delta\omega\, t_{dx}}$ --

Col. 8, line 65, Equation (9) delete

" $S(t) = \frac{1}{2a} \int_{x-a}^{x+a} e^{i\gamma x \int_0^t G(t') dt'} dx$ " and replace with -- $S(t) = \frac{1}{2a} \int_{x-a}^{x+a} e^{i\gamma x \int_0^t G(t') dt'} dx$ --

Col. 9, line 35, Equation (14) delete

" $A_k \equiv \alpha_k \left(1 - e^{-T_o/\tau_k}\right) \tau_k$ " and replace with

UNITED STATES PATENT AND TRADEMARK OFFICE
CERTIFICATE OF CORRECTION

PATENT NO. : 4,698,591

DATED : October 6, 1987

INVENTOR(S) : Gary H. Glover and Norbert J. Pelc

It is certified that error appears in the above-identified patent and that said Letters Patent is hereby corrected as shown below:

$$-- A_k \equiv \alpha_k \left(1 - e^{-T_o/\tau_k}\right) \tau_k --$$

Signed and Sealed this

Twenty-fifth Day of October, 1988

*Attest:*

DONALD J. QUIGG

*Attesting Officer*  *Commissioner of Patents and Trademarks*